(12) United States Patent
Shen

(10) Patent No.: US 7,084,499 B2
(45) Date of Patent: Aug. 1, 2006

(54) SEMICONDUCTOR PACKAGE AND METHOD FOR MAKING THE SAME

(76) Inventor: Yu-Nung Shen, 4F, No. 52, Sec. 2, Chung-Shan N. Rd., Taipei City (TW)

(*) Notice: Subject to any disclaimer, the term of this patent is extended or adjusted under 35 U.S.C. 154(b) by 0 days.

(21) Appl. No.: 10/725,865

(22) Filed: Dec. 1, 2003

(65) Prior Publication Data
US 2004/0108595 A1 Jun. 10, 2004

(30) Foreign Application Priority Data
Dec. 2, 2002 (TW) ............................... 91134965 A

(51) Int. Cl.
H01L 23/48 (2006.01)
H01L 23/52 (2006.01)
H01L 29/40 (2006.01)
(52) U.S. Cl. ..................... 257/737; 257/738; 257/780; 257/784; 257/786
(58) Field of Classification Search ........ 257/690–693, 257/781, 784, 786, 737–738, 780; 438/612–623, 438/666; 361/765, 777–778
See application file for complete search history.

(56) References Cited

U.S. PATENT DOCUMENTS

| | | | | |
|---|---|---|---|---|
| 5,933,169 A * | 8/1999 | Sugahara ..................... 347/71 |
| 6,426,545 B1 * | 7/2002 | Eichelberger et al. ...... 257/633 |
| 6,660,626 B1 * | 12/2003 | Lin ............................. 438/618 |
| 6,701,614 B1 * | 3/2004 | Ding et al. .................... 29/848 |
| 6,891,248 B1 * | 5/2005 | Akram et al. ............... 257/532 |
| 2003/0201534 A1 * | 10/2003 | Eichelberger et al. ...... 257/737 |

* cited by examiner

Primary Examiner—Zandra V. Smith
Assistant Examiner—Thanh Y. Tran
(74) Attorney, Agent, or Firm—Christensen O'Connor Johnson Kindness PLLC

(57) ABSTRACT

A method for making a semiconductor package includes preparing a die with bonding pads, forming conductive bodies on the die such that each conductive body is electrically connected to a respective bonding pad and has a trace part offset from the respective bonding pad, forming an encapsulant on each bonding pad, forming a protective layer on the die and the encapsulant, and forming conductive bumps such that each bump is electrically connected to the trace part of a respective conductive body and protrudes outwardly from the protective layer.

14 Claims, 22 Drawing Sheets

SEMICONDUCTOR PACKAGE AND METHOD FOR MAKING THE SAME

CROSS-REFERENCE TO RELATED APPLICATION

This application claims priority of Taiwanese application No. 091134965, filed on Dec. 2, 2002.

BACKGROUND OF THE INVENTION

1. Field of the Invention

This invention relates to a semiconductor package, and more particularly to a BGA-based (Ball Grid Array-based) semiconductor package and to a method for making the same.

2. Description of the Related Art

Conventional lead-based semiconductor packages normally include a semiconductor die with bonding pads that are connected electrically and respectively to leads of a lead frame through bonding wires so as to connect internal circuits of the semiconductor die to external circuits through the leads. The conventional semiconductor packages thus formed have relatively large dimensions. Conventional ball grid array (BGA) based semiconductor packages have smaller dimensions as compared to those of the lead-based semiconductor packages. U.S. Pat. No. 5,384,689 discloses a BGA-based semiconductor package that uses a printed circuit board with conductive strips for connecting internal circuits of a semiconductor die to external circuits. However, since the configuration of the printed circuit board depends on the arrangement of the bonding pads on the semiconductor die, manufacturing of different semiconductor dies requires different configurations of the printed circuit boards that respectively correspond to the arrangements of the bonding pads on the semiconductor dies, thereby increasing the stock cost and prolonging the manufacturing time period of the semiconductor package since the manufacturing time period of the corresponding PCB must be taken into account.

SUMMARY OF THE INVENTION

The object of the present invention is to provide a semiconductor package that is capable of overcoming the aforesaid drawback of the prior art.

Another object of the present invention is to provide a method for making the semiconductor package.

According to one aspect of the present invention, there is provided a semiconductor package that comprises: a semiconductor die having a pad-mounting surface, and a plurality of spaced apart bonding pads formed on the pad-mounting surface; a plurality of conductive bodies, each of which has a trace part that is formed on the pad-mounting surface and that is offset from a respective one of the bonding pads in a lateral direction relative to the pad-mounting surface, and a pad-connecting part that extends from the trace part to connect electrically with the respective one of the bonding pads; a dielectric protective layer formed on the pad-mounting surface and the conductive bodies and formed with a plurality of bump-through-holes, each of which exposes a portion of the trace part of a respective one of the conductive bodies; and a plurality of solder bumps, each of which fills a respective one of the bump-through-holes to connect electrically with the portion of the trace part of a respective one of the conductive bodies and each of which protrudes outwardly from the protective layer.

According to another aspect of the present invention, there is provided a method for making the semiconductor package. The method comprises the steps of: preparing a semiconductor die that has a pad-mounting surface, and a plurality of spaced apart bonding pads formed on the pad-mounting surface; forming a plurality of conductive bodies, each of which has a trace part that is formed on the pad-mounting surface and that is offset from a respective one of the bonding pads in a lateral direction relative to the pad-mounting surface, and a pad-connecting part that extends from the trace part to connect electrically with the respective one of the bonding pads; forming a dielectric layer on the pad-mounting surface and the conductive bodies; patterning and etching the dielectric layer so as to form the dielectric layer into a pair of opposite dielectric partition walls that are disposed at two opposite sides of each of the bonding pads, the trace part of each of the conductive bodies extending through a respective one of the partition walls in a transverse direction relative to the partition walls in such a manner that the pad-connecting part of each of the conductive bodies is disposed between the partition walls, the partition walls defining an inner space therebetween; filling the inner space with an encapsulant so as to cover the bonding pads; forming a dielectric protective layer on the pad-mounting surface, the conductive bodies, and the encapsulant; forming a plurality of bump-through-holes in the protective layer, each of the bump-through-holes exposing a portion of the trace part of a respective one of the conductive bodies; and forming a plurality of solder bumps, each of which fills a respective one of the bump-through-holes to connect electrically with the portion of the trace part of a respective one of the conductive bodies, and each of which protrudes outwardly from the protective layer.

BRIEF DESCRIPTION OF THE DRAWINGS

In drawings which illustrate embodiments of the invention.

DETAILED DESCRIPTION OF THE PREFERRED EMBODIMENTS

Figure 1:
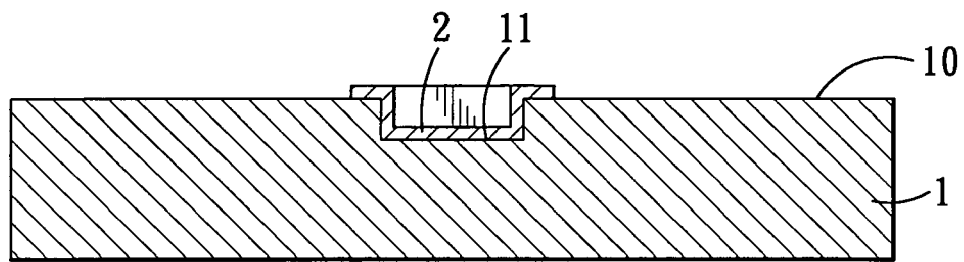
FIG. 1 is a schematic view to illustrate how a metal plating layer is formed on a bonding pad of a semiconductor die of a semiconductor package according to the first preferred embodiment of a method of this invention.
Figure 2:
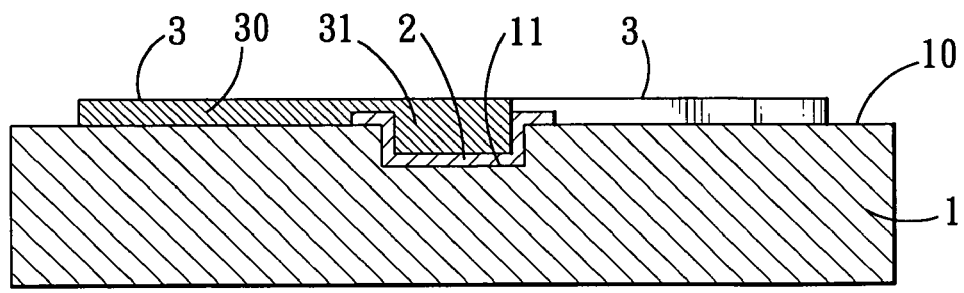
FIGS. 2 and 3 are schematic views to illustrate how conductive bodies are formed on the metal plating layers on the bonding pads according to the first preferred embodiment of this invention.
Figure 3:
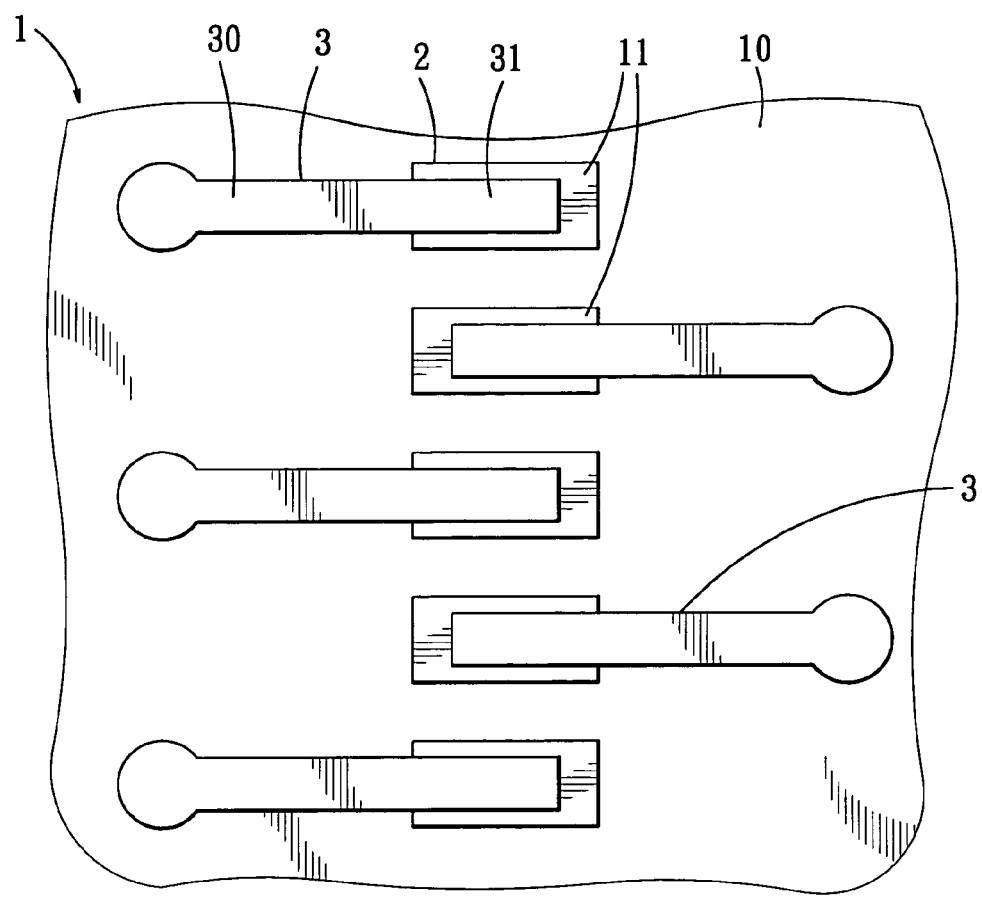

For the sake of brevity, like elements are denoted by the same reference numerals throughout the disclosure.

FIGS. 1 to 9 and FIG. 43 illustrate consecutive steps of forming a semiconductor package according to the first preferred embodiment of the method of this invention.

The method of this embodiment includes the steps of: preparing a semiconductor die 1 that has a pad-mounting surface 10, and a plurality of spaced apart bonding pads 11 (only one is shown) formed on the pad-mounting surface 10 (see FIG. 1); forming a plurality of metal plating layers 2 on the bonding pads 11, respectively (see FIG. 1); forming a plurality of conductive bodies 3 of conductive paste by means of any suitable printing method, each of which has a trace part 30 that is formed on the pad-mounting surface 10 and that is offset from a respective one of the bonding pads 11 in a lateral direction relative to the pad-mounting surface 10, and a pad-connecting part 31 that extends from the trace part 30 to connect electrically with the respective one of the bonding pads 11 (see FIGS. 2 and 3); forming a dielectric layer 4 on the pad-mounting surface 10 and the conductive bodies 3 (see FIG. 4), the dielectric layer 4 being made from a photo-sensitive ink; patterning and etching the dielectric layer 4 so as to form the dielectric layer 4 into a pair of opposite dielectric partition walls 41 that are disposed at two opposite sides of each of the bonding pads 11 (see FIGS. 5 and 6), the trace part 30 of each of the conductive bodies 3 extending through a respective one of the partition walls 4 in a transverse direction relative to the partition walls 41 in such a manner that the pad-connecting part 31 of each of the conductive bodies 3 is disposed between the partition walls 4, the partition walls 41 defining an inner space therebetween; filling the inner space with encapsulant so as to cover the bonding pads 11 (see FIG. 7), the encapsulant 5 being made from an insulating material, such as epoxy resin, polyimide, or a photo-sensitive ink; forming a dielectric protective layer 6 on the pad-mounting surface 10, the conductive bodies 3, and the encapsulant 5 (see FIG. 9), the protective layer 6 being made from the aforesaid plastic material; forming a plurality of bump-through-holes 60 in the protective layer 6, each of the bump-through-holes 60 exposing a portion of the trace part 30 of a respective one of the conductive bodies 3 (see FIG. 9); and forming a plurality of solder bumps 61 (see FIG. 9), each of which fills a respective one of the bump-through-holes 60 to connect electrically with the portion of the trace part 30 of a respective one of the conductive bodies 3, and each of which protrudes outwardly from the protective layer 6. Note that, on a portion of the trace part 30 of each conductive body 3 outside the inner space, a metal layer 32 (see FIG. 8) consisting of a nickel sub-layer 320 on a gold sub-layer 321 can be formed in such a manner that the solder bumps 61 are electrically connected with the conductive body 3. The method of this invention can be applied to the processing of a semiconductor wafer (not shown), which includes a plurality of semiconductor dies, instead of a single semiconductor die as described in the aforesaid preferred embodiment.

Figure 9:
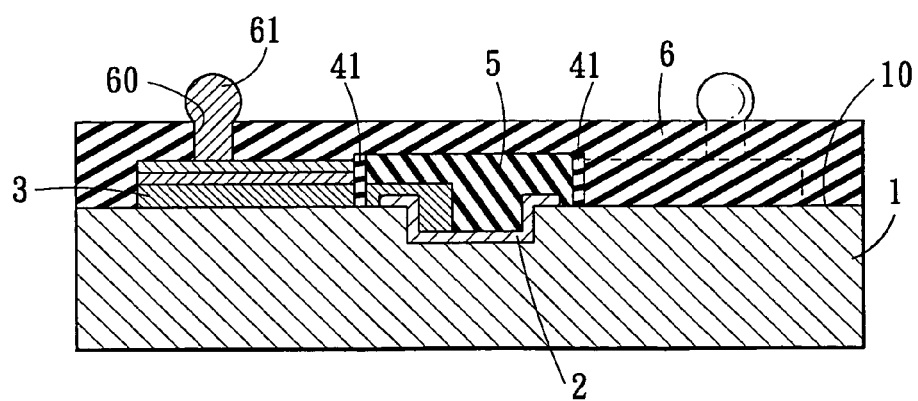
FIG. 9 is a schematic view to illustrate how a dielectric protective layer is formed on the semiconductor die and how conductive bumps are formed on the protective layer according to the first preferred embodiment of this invention.
Figure 10:
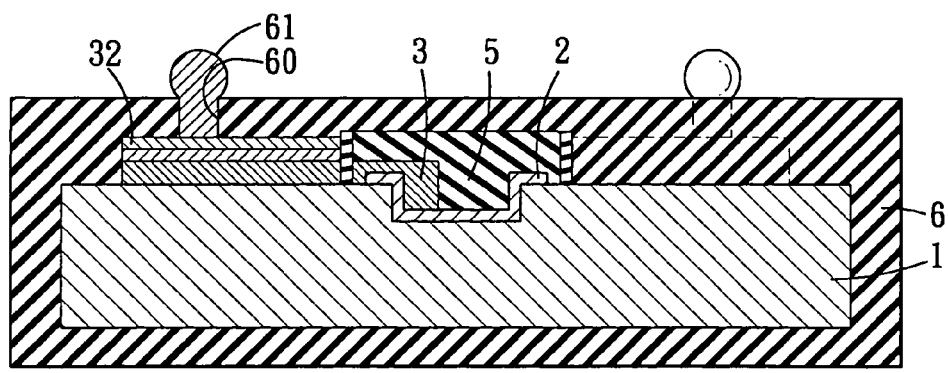
FIG. 10 is a schematic view showing a modified dielectric protective layer that is modified from the protective layer shown in FIG. 9.
Figure 11:
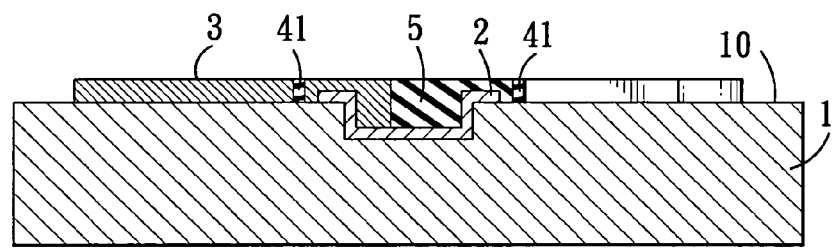
FIG. 11 is a schematic view to illustrate how the partition walls and the encapsulant shown in FIG. 7 are ground prior to formation of the metal layer according to the second preferred embodiment of the method of this invention.
Figure 12:
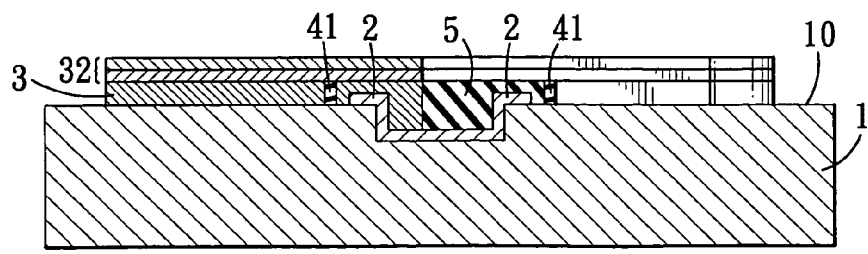
FIG. 12 is a schematic view to illustrate how the metal layer is formed on the conductive body according to the second preferred embodiment of this invention, which is similar to the step of the first preferred embodiment shown in FIG. 8.
Figure 13:
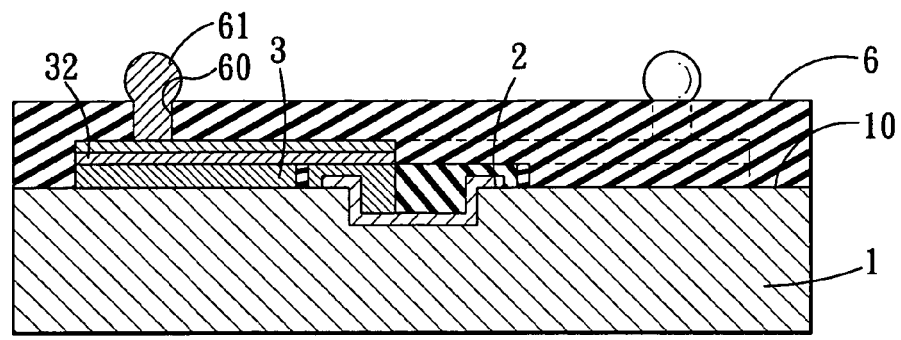
FIG. 13 is a schematic view to illustrate how the dielectric protective layer is formed on the semiconductor die and how the conductive bumps are formed on the protective layer according to the second preferred embodiment of this invention, which are similar to the steps of the first preferred embodiment shown in FIG. 9.
Figure 14:
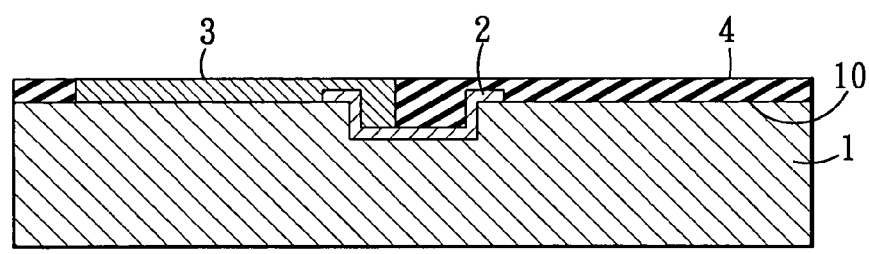
FIG. 14 is a schematic view to illustrate how the dielectric layer shown in FIG. 4 is ground to expose the conductive body therefrom according to the third preferred embodiment of this invention.
Figure 15:
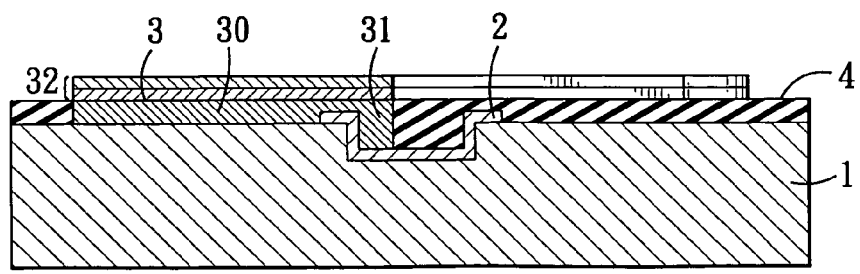
FIG. 15 is a schematic view to illustrate how the metal layer is formed on the conductive body according to the third preferred embodiment of this invention, which is similar to the step of the first preferred embodiment shown in FIG. 8.
Figure 16:
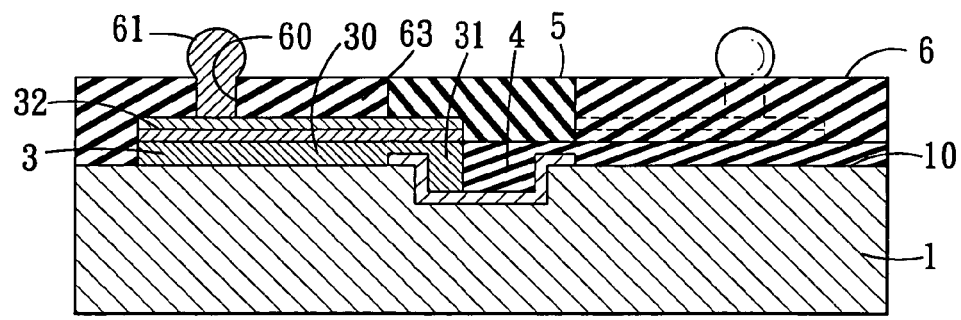
FIG. 16 is a schematic view to illustrate how the protective layer is formed on the semiconductor die, how a through-hole in the protective layer is filled with encapsulant, and how the conductive bump is formed on the protective layer according to the third preferred embodiment of this invention.

FIG. 10 illustrates a modified dielectric protective layer 6, which is modified from that of the semiconductor package shown in FIG. 9, and which encloses the semiconductor die 1.

Figure 7:
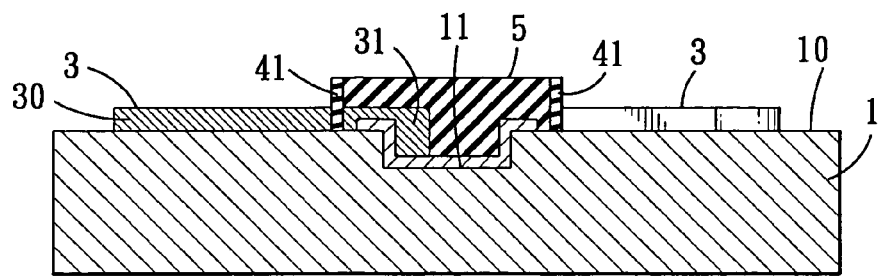
FIG. 7 is a schematic view to illustrate how an encapsulant fills in a space between the partition walls according to the first preferred embodiment of this invention.
Figure 8:
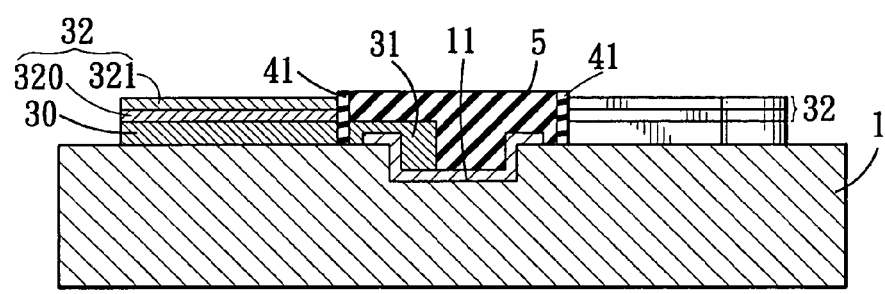
FIG. 8 is a schematic view to illustrate how a metal layer is formed on the conductive body according to the first preferred embodiment of this invention.

FIGS. 11 to 13 and FIG. 44 illustrate consecutive steps of forming a semiconductor package according to the second preferred embodiment of the method of this invention. The method of this embodiment differs from the previous embodiment in that the partition walls 41 and the encapsulant 5 shown in FIG. 7 are ground prior to the formation of the metal layers 32 to an extent where the height of the trace part 30 of each of the conductive bodies 3 is substantially equal to those of the partition walls 41 and the encapsulant 5 (see FIG. 11), and that each of the metal layers 32 is formed on a respective one of the conductive bodies 3 including the portion inside the inner space. Subsequent steps of formation of the protective layer 6, and the conductive bumps 61 (see FIGS. 12 and 13) are similar to those of the previous embodiment.

Figure 4:
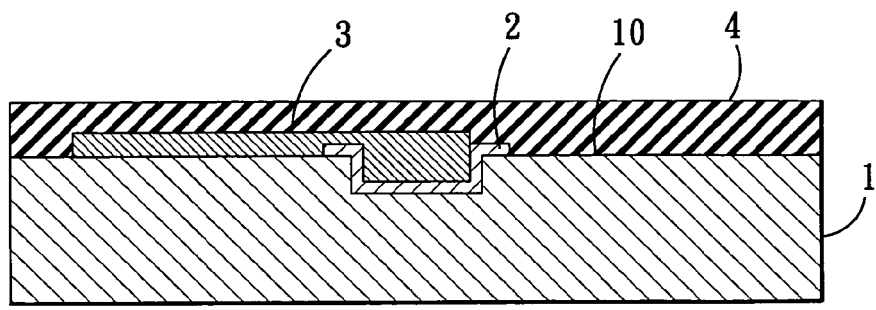
FIG. 4 is a schematic view to illustrate how a dielectric layer is formed on the semiconductor die according to the first preferred embodiment of this invention.
Figure 5:
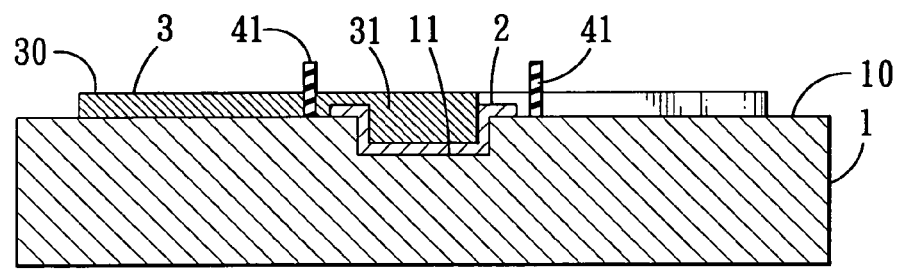
FIGS. 5 and 6 are schematic views to illustrate how the dielectric layer is patterned and etched to form a pair of partition walls according to the first preferred embodiment of this invention.
Figure 6:
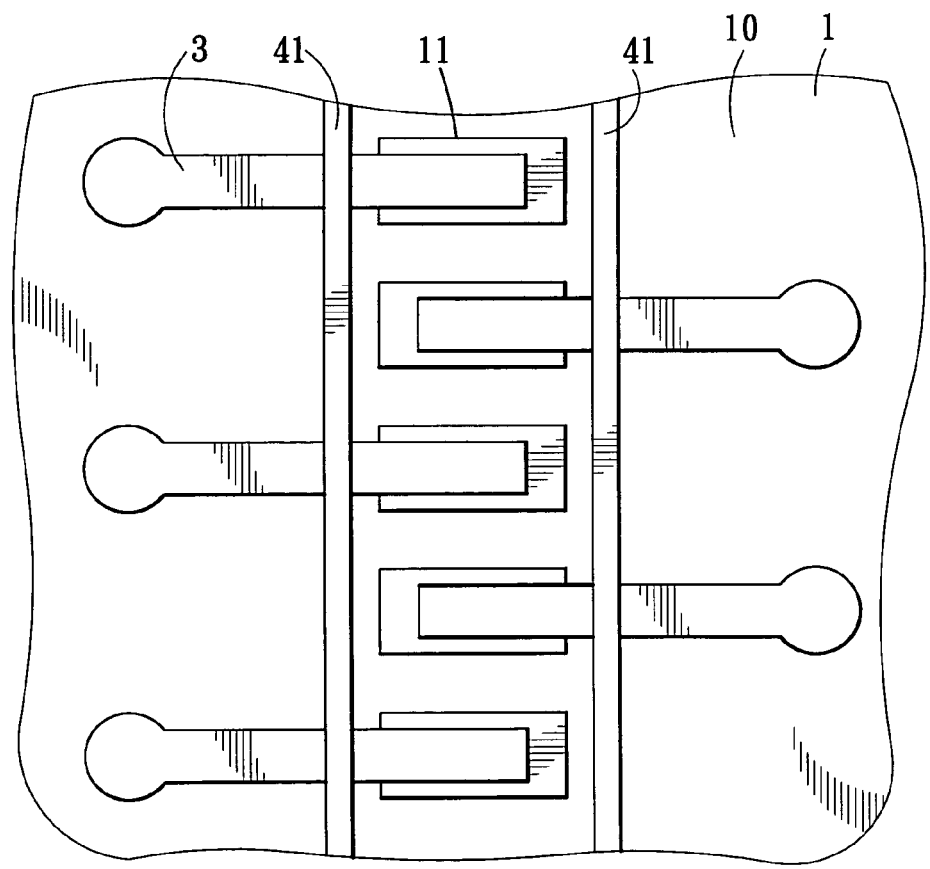

FIGS. 14 to 16 and FIG. 45 illustrate consecutive steps of forming a semiconductor package according to the third preferred embodiment of the method of this invention. The method of this embodiment differs from the first embodiment in that the dielectric layer 4 shown in FIG. 4 is ground prior to the formation of the metal layers 32 to an extent where the conductive bodies 3 are exposed therefrom (see FIG. 14). Subsequent steps of formation of the metal layers 32, the protective layer 6, and the conductive bumps 61 (see FIGS. 15 and 16) are similar to those of the first embodiment, except that the dielectric protective layer 6 is further formed with a pad-through-hole 63, which exposes the pad-connecting parts 31 and portions of the trace parts 30 of the conductive bodies 3, and that the encapsulant 5 fills the pad-through-hole 63 to cover the pad-connecting parts 31 and the end portions of the trace parts 30.

FIGS. 17 to 20 and FIG. 46 illustrate consecutive steps of forming a semiconductor package according to the fourth preferred embodiment of the method of this invention. The method of this embodiment differs from the first embodiment in that the dielectric layer 4 is formed on the pad-mounting surface 10 prior to the formation of the conductive bodies 3 (see FIG. 17), and is subsequently patterned so as to form a plurality of trace-through-holes 40 in the dielectric layer 4 (see FIG. 18). Each of the trace-through-holes 40 has an end section 401 that exposes a respective one of the bonding pads 11 therefrom, and a trace section 42 that extends from the end section 401 in a lateral direction relative to the pad-mounting surface 10. The trace part 30 of each of the conductive bodies 3 fills the trace section 42 of a respective one of the trace-through-holes 40, whereas the pad-connecting part 31 of each of the conductive bodies 3 fills the end section 401 of the respective one of the trace-through-holes 40 to connect electrically with the respective one of the bonding pads 11 through the respective metal plating layer 2 (see FIG. 19). Subsequent steps of formation of the protective layer 6, the encapsulant 5, and the conductive bumps 61 (see FIGS. 19 and 20) are similar to those of the third embodiment.

Figure 21:
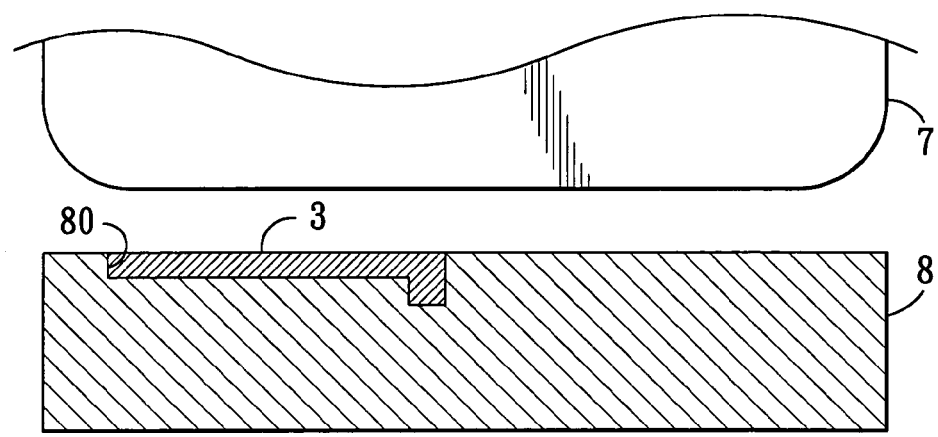
FIG. 21 is a schematic view to illustrate how the conductive body is formed by printing techniques using a mold and a printing head according to the method of this invention.
Figure 22:
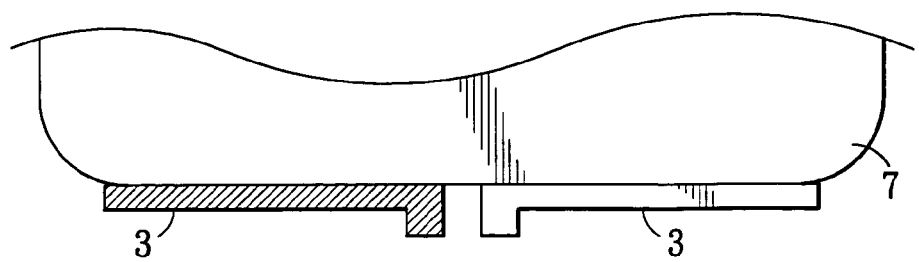
FIG. 22 is a schematic view to illustrate how the conductive body is attached to and is carried by the printing head according to the method of this invention.
Figure 23:
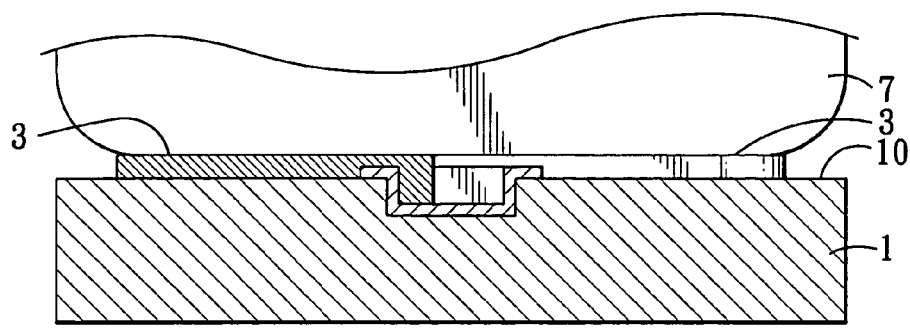
FIG. 23 is a schematic view to illustrate how the conductive body is attached to the semiconductor die using the printing head according to the method of this invention.
Figure 24:
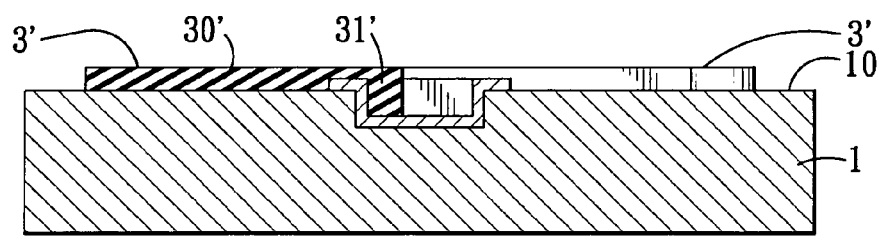
FIG. 24 is a schematic view to illustrate how a dielectric strip is formed on the semiconductor die according to the fifth preferred embodiment of this invention.
Figure 25:
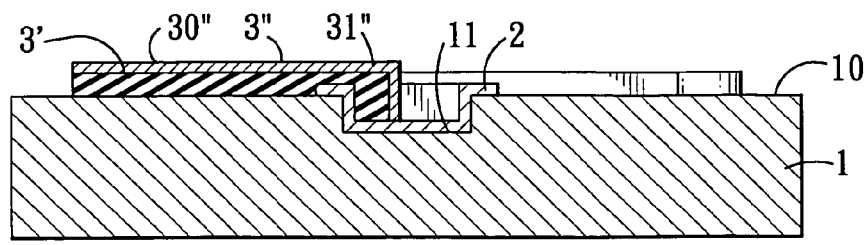
FIG. 25 is a schematic view to illustrate how a plating layer is formed on the dielectric strip and is electrically connected to the bonding pad of the semiconductor die according to the fifth preferred embodiment of this invention.
Figure 26:
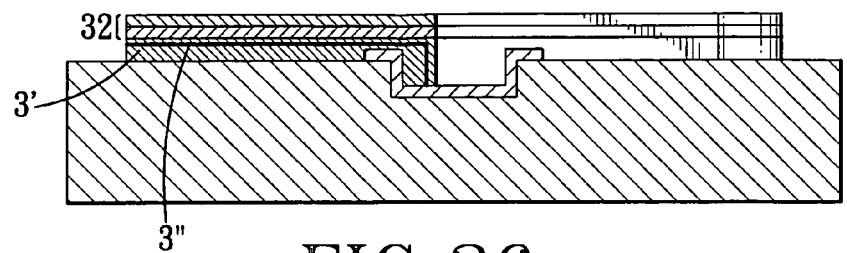
FIG. 26 is a schematic view to illustrate how the metal layer is formed on the plating layer according to the fifth preferred embodiment of this invention.
Figure 27:
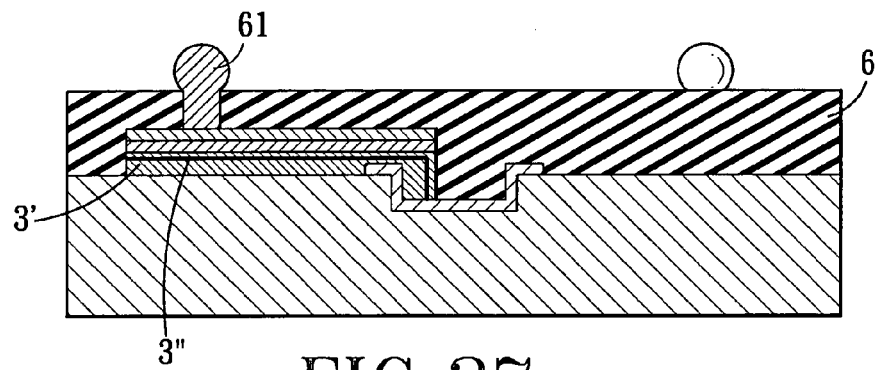
FIG. 27 is a schematic view to illustrate how the dielectric protective layer is formed on the semiconductor die and how the conductive bump is formed on the protective layer according to the fifth preferred embodiment of this invention, which are similar to the steps of the first preferred embodiment shown in FIG. 9.

FIGS. 21 to 23 illustrate one of the conductive body formation methods using a mold 8 and a mobile printing head 7. The conductive body 3 is formed in a cavity 80 in the mold 8 with desired dimensions, and is attached to and is carried by the printing head 7 to a desired position where the conductive body 3 registers with a printing region on the semiconductor die 1.

Figure 17:
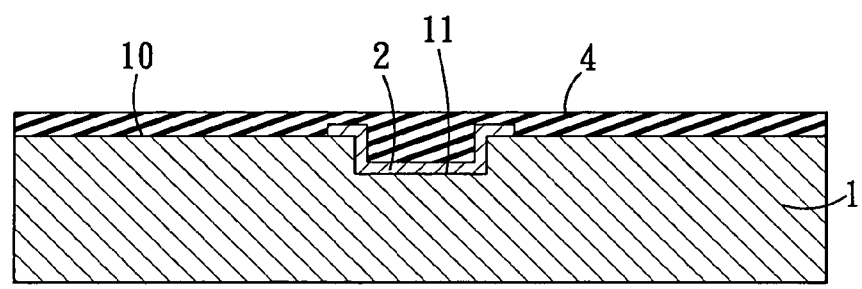
FIG. 17 is a schematic view to illustrate how the dielectric layer is formed on the semiconductor die prior to formation of the conductive body shown in FIG. 2 according to the fourth preferred embodiment of this invention.
Figure 18:
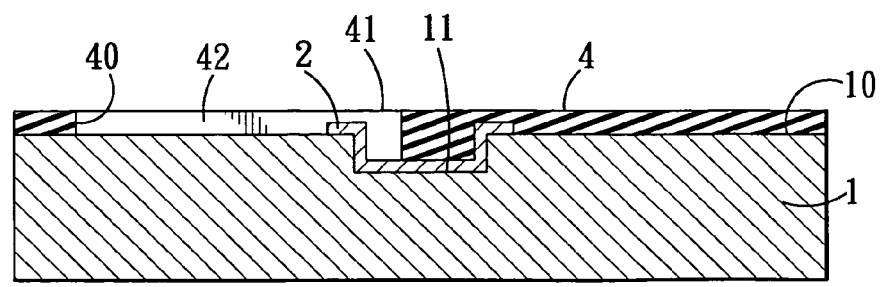
FIG. 18 is a schematic view to illustrate how a trace-through-hole is formed in the dielectric layer according to the fourth preferred embodiment of this invention.
Figure 19:
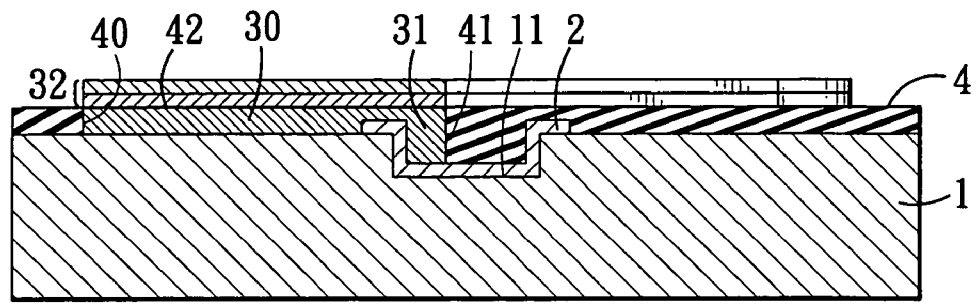
FIG. 19 is a schematic view to illustrate how the conductive body is formed in the trace-through-hole in the dielectric layer and how the metal layer is formed on the conductive body according to the fourth preferred embodiment of this invention.
Figure 20:
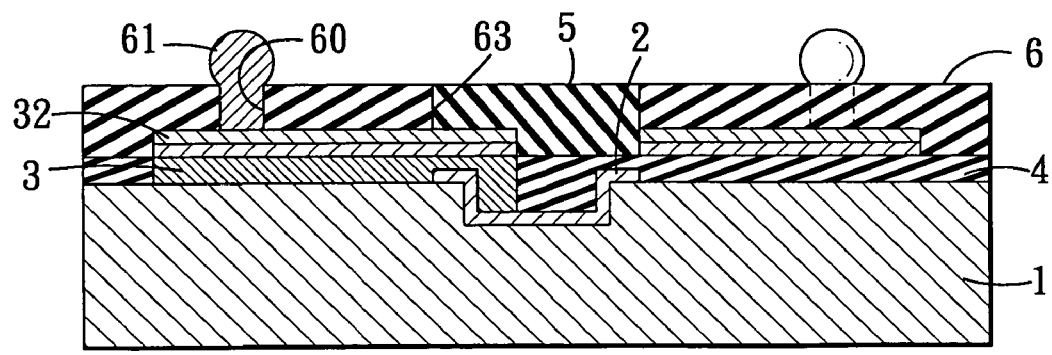
FIG. 20 is a schematic view to illustrate how the protective layer is formed on the semiconductor die, how a through-hole in the protective layer is filled with encapsulant, and how the conductive bump is formed on the protective layer according to the third preferred embodiment of this invention, which are similar to the steps of the third preferred embodiment shown in FIGS. 16.

FIGS. 24 to 27 and FIG. 47 illustrate consecutive steps of forming the semiconductor package according to the fifth preferred embodiment of the method of this invention. The method of this embodiment differs from the fourth embodiment in that the dielectric layer 4 shown in FIG. 17 is patterned so as to form the dielectric layer 4 into a plurality of strips 3', each of which has a pad-connecting segment 31' that is connected to a respective one of the bonding pads 11, and an extension 30' that extends from the pad-connecting segment 31' and that is offset from the respective one of the bonding pads 11 in a lateral direction relative to the pad-mounting surface 10. A trace plating layer 3" is formed on each of the strips 3' by means of sputtering, electrolytic plating, electroless plating, etc, in such a manner that the trace plating layer 3" has a pad-connecting part 31" which is formed on the pad-connecting segment 31' of a respective one of the strips 3' and which is electrically connected to a respective one of the bonding pads 11, and a trace part 30" that extends from the pad-connecting part 31" and that is formed on the extension 30' of the respective one of the strips 3'. Subsequent steps of formation of a metal layer 32 on the trace part 30" and the protective layer 6, and the conductive bumps 61 (see FIGS. 26 and 27) are similar to those of the fourth embodiment. The encapsulant 5 required in the previous embodiments is obviated in this embodiment.

Figure 28:
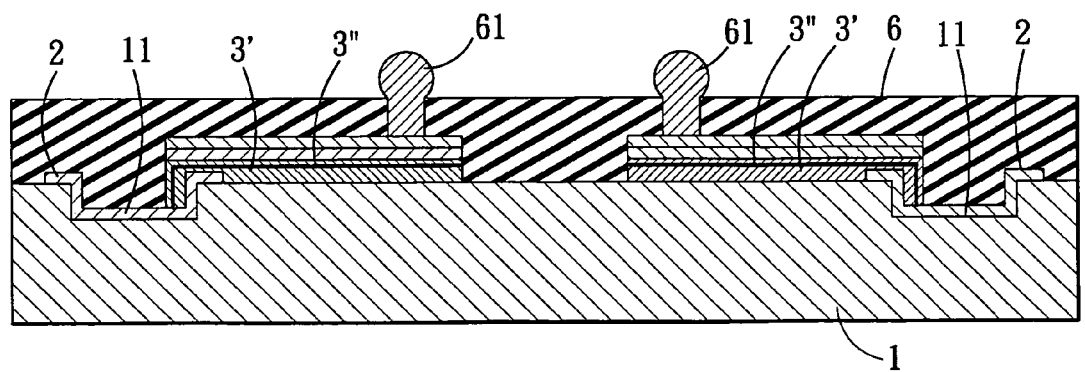
FIG. 28 is a schematic view to illustrate a different configuration of the semiconductor package, which differs from that of the semiconductor package shown in FIG. 9 in the arrangement of the bonding pads of the semiconductor die.

FIG. 28 illustrates a different configuration of the semiconductor package, which differs from those of the semiconductor packages of the previous embodiment in the arrangement of the bonding pads 11 of the semiconductor die 1. In FIG. 28, the bonding pads 11 are arranged at two opposite sides of the semiconductor die 1.

Figure 29:
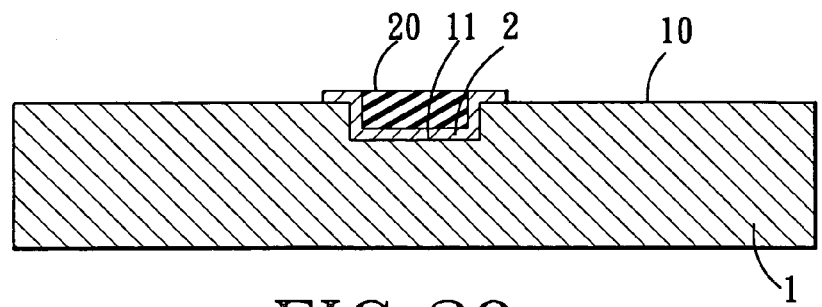
FIGS. 29 to 31 are schematic views to illustrate consecutive steps of the formation of a connection-enhancing boss on the bonding pad according to the method of this invention.
Figure 30:
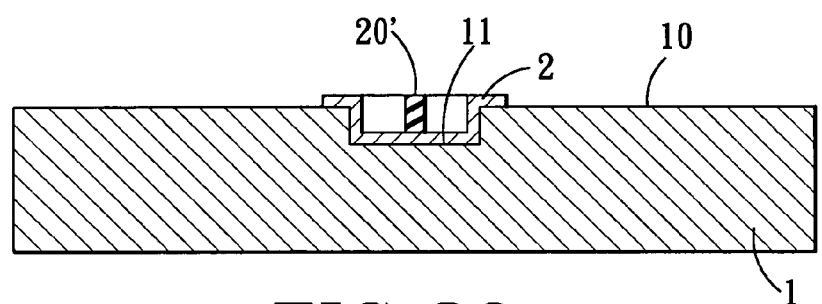
Figure 31:
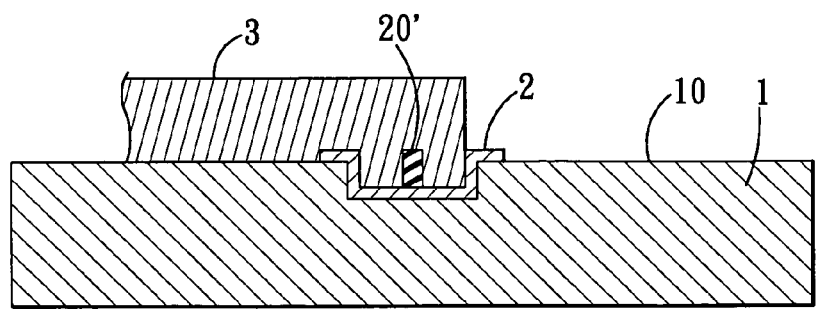

FIGS. 29 to 31 illustrate consecutive steps of the formation of a connection-enhancing boss 20' on the metal plating layer 2 on each of the bonding pads 11 prior to the formation of the conductive bodies 3 in the first embodiment. The connection-enhancing boss 20' is formed by forming a dielectric layer 20 on the metal plating layer 2 (see FIG. 29) and etching the dielectric layer 20 to a desired shape of the connection-enhancing boss 20' (see FIG. 30). The pad-connecting part 31 of each of the conductive bodies 3 is formed on the respective one of the metal plating layers 2, and encloses the connection-enhancing boss 20' on the respective metal plating layer 2 (see FIG. 31) so as to prevent the pad-connecting part 31 from peeling from the metal plating layer 2 on the respective bonding pad 11.

Figure 32:
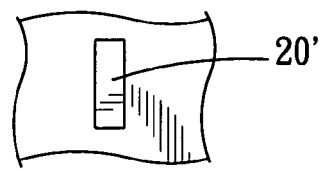
FIGS. 32 to 34 are schematic views to illustrate different shapes of the connection-enhancing boss according to the method of this invention.
Figure 33:
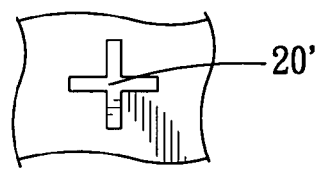
Figure 34:
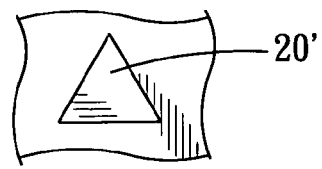
Figure 35:
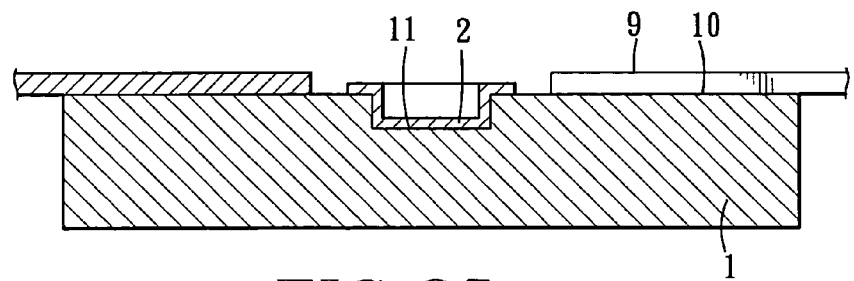
FIG. 35 is a schematic view to illustrate how a plurality of leads of a lead frame are attached to the semiconductor die according to the sixth preferred embodiment of the method of this invention.
Figure 36:
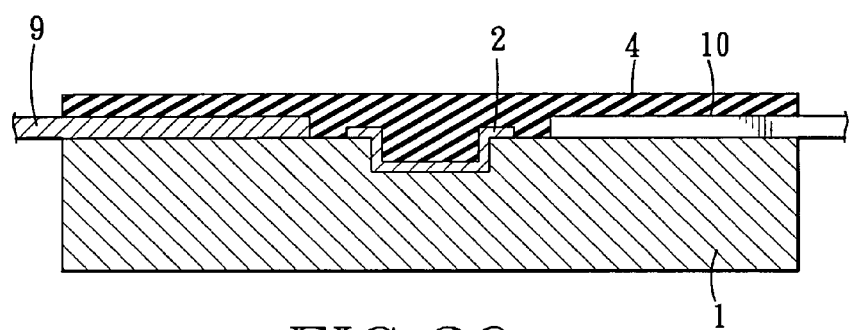
FIG. 36 is a schematic view to illustrate how a dielectric layer is formed on the semiconductor die according to the sixth preferred embodiment of this invention.
Figure 37:
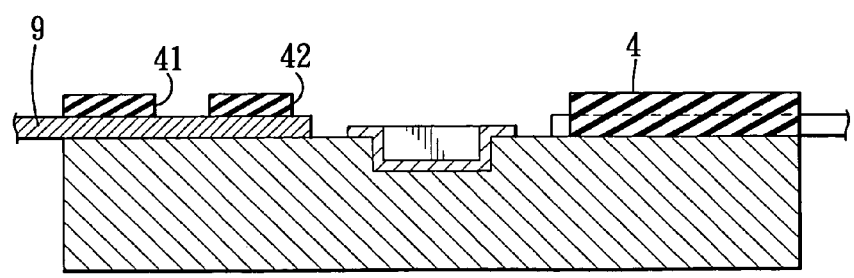
FIG. 37 is a schematic view to illustrate how the dielectric layer is patterned and etched to form a plurality of trace-through-holes and a plurality of pad-through-holes according to the sixth preferred embodiment of this invention.

FIGS. 32 to 34 illustrate different shapes of the connection-enhancing boss 20' that can be formed on the metal plating layer 2 according to the method of this invention.

FIGS. 35 to 38 and FIG. 48 illustrate consecutive steps of forming a semiconductor package according to the sixth preferred embodiment of the method of this invention.

Figure 38:
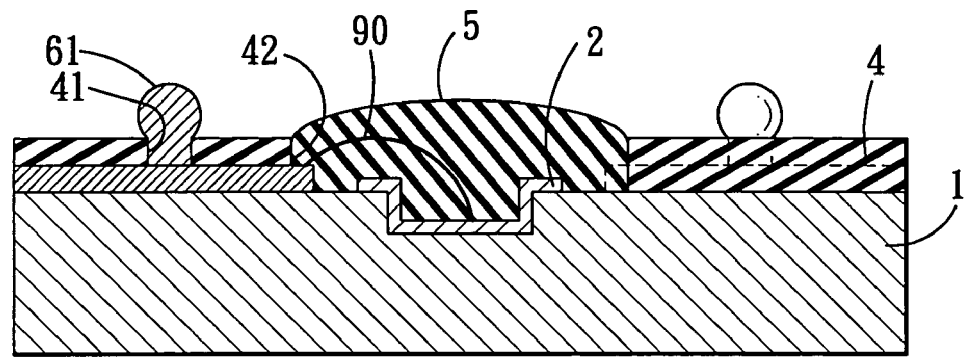
FIG. 38 is a schematic view to illustrate how the lead is connected to the bonding pad through a bonding wire, how a dielectric protective layer is formed on the semiconductor die, and how a conductive bump is formed on the protective layer according to the sixth preferred embodiment of this invention.

The method of this embodiment includes the steps of: preparing a semiconductor die 1 that has a pad-mounting surface 10 and a plurality of spaced apart bonding pads 11 formed on the pad-mounting surface 10; attaching a plurality of leads 9 (which can be formed from a lead frame) on the pad-mounting surface 10 (see FIG. 35), each of the leads 9 being offset from a respective one of the bonding pads 11 in a lateral direction relative to the pad-mounting surface 10 and having an end portion that is disposed adjacent to a respective one of the bonding pads 11; forming a dielectric layer 4 on the pad-mounting surface 10 and the leads 9 (see FIG. 36); patterning and etching the dielectric layer 4 so as to form a plurality of bump-through-holes 41 and a pad-through-hole 42 in the dielectric layer 4 (see FIG. 37), each of the bump-through-holes 41 exposing a portion of the leads 9 therefrom, the pad-through-hole 42 exposing the end portions of the leads 9 and the bonding pads 11 therefrom; forming a plurality of conductive bodies 90, each of which is in the form of a bonding wire, each of which is disposed in a respective one of the pad-through-holes 42, and each of which electrically interconnects a respective one of the leads 9 and a respective one of the bonding pads 11 through a metal plating layer 2 (see FIG. 38); filling the pad-through-hole 42 with an encapsulant 5 to cover the conductive bodies 90 and the bonding pads 11 (see FIG. 38); and forming a plurality of solder bumps 61, each of which fills a respective one of the bump-through-holes 41 to connect electrically with the portion of a respective one of the leads 9, and each of which protrudes outwardly from the dielectric layer 4 (see FIG. 38). An excess portion of each lead 9 is cut.

Figure 39:
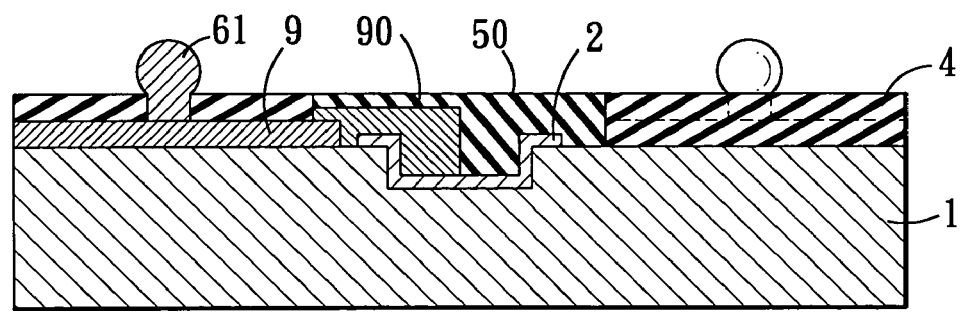
FIG. 39 is a schematic view to illustrate how the lead is connected to the bonding pad through a conductive paste instead of the bonding wire according to the seventh preferred embodiment of the method of this invention.
Figure 49:
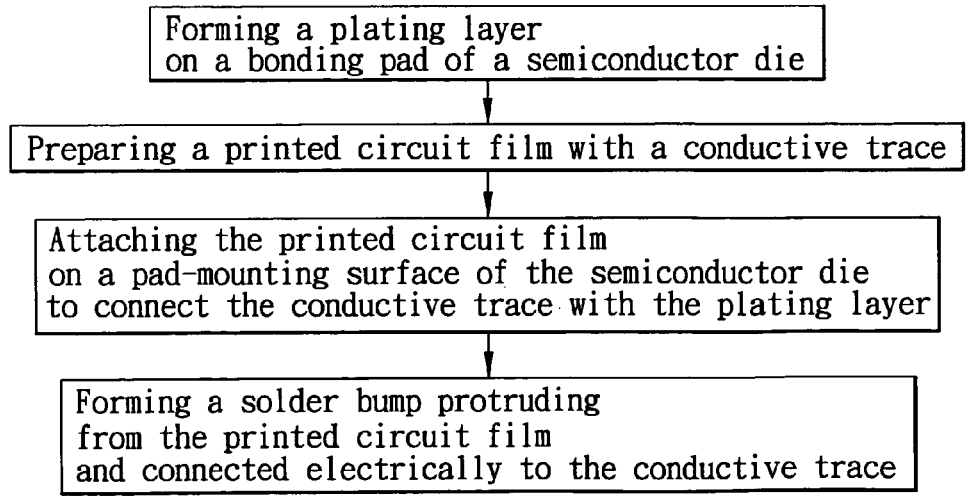
FIG. 49 is a block diagram illustrating the seventh preferred embodiment of the method for making the semiconductor package according to the present invention.

FIGS. 39 and 49 illustrate a semiconductor package of the seventh preferred embodiment which is modified from that shown in FIG. 38. Instead of being in the form of a bonding wire, each of the conductive bodies 90 of the semiconductor package is made from a conductive paste consisting of a non-conductive material with a plating layer as described in the fifth preferred embodiment.

Figure 40:
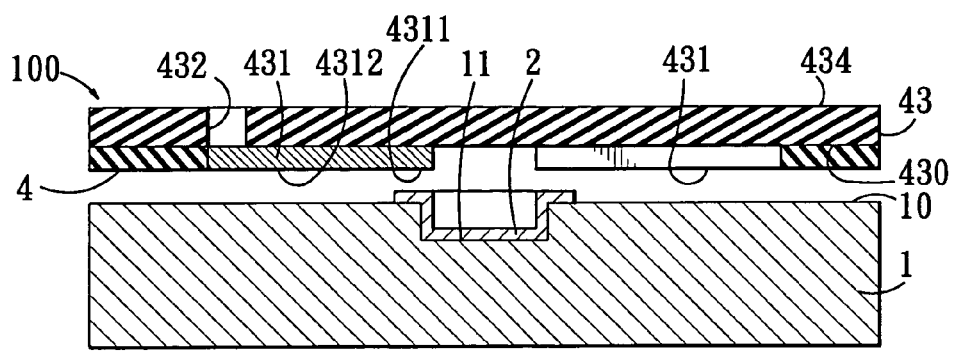
FIG. 40 is a schematic view to illustrate how a printed circuit board is attached to the semiconductor die according to the eighth preferred embodiment of the method of this invention.
Figure 41:
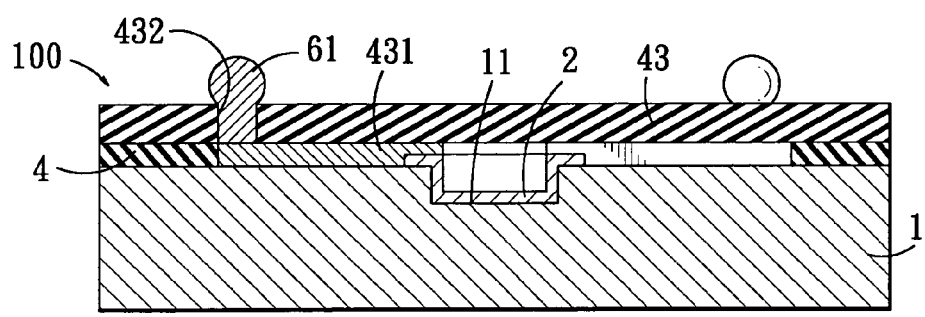
FIG. 41 is a schematic view to illustrate how a conductive bump is formed on the printed circuit board according to the eighth preferred embodiment of this invention.

FIGS. 40 and 41 illustrate consecutive steps of forming a semiconductor package according to the eighth preferred embodiment of the method of this invention.

The method of this embodiment includes the steps of: preparing a semiconductor die 1 that has a pad-mounting surface 10, and a plurality of spaced apart bonding pads 11 formed on the pad-mounting surface 10; preparing a printed circuit film 100 that includes a film substrate 43 which has a trace-forming surface 430, a back surface 434 opposite to the trace-forming surface 430, and a plurality of conductive traces 431 that are formed on the trace-forming surface 430, each of the traces 431 having an end portion 4311 and an extension 4312 that extends from the end portion 4311, the film substrate 43 being formed with a plurality of bump-through-holes 432, each of which exposes a portion of the extension 4312 of a respective one of the conductive traces 431, the printed circuit film 100 further including an adhesive layer 4' formed on the trace-forming surface 430; attaching the printed circuit film 100 to the semiconductor die 1 through the adhesive layer 4' in such a manner that the trace-forming surface 430 is bonded to the pad-mounting surface 10 and that the end portion 4311 of each of the conductive traces 431 is connected electrically to a respective one of the bonding pads 11 through a metal plating layer 2 and that the extension 4312 of each of the traces 431 is bonded to the pad-mounting surface 10 and is offset from the respective one of the bonding pads 11 in a lateral direction relative to the pad-mounting surface 10; and forming a plurality of solder bumps 61, each of which fills a respective one of the bump-through-holes 432 to connect electrically with the portion of the extension 4312 of a respective one of the traces 431, and each of which protrudes outwardly from the film substrate 43.

Figure 42:
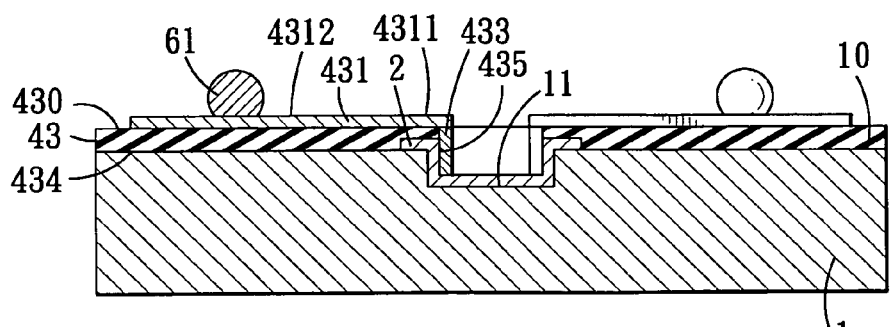
FIG. 42 is a schematic view to illustrate how the printed circuit board is attached to the semiconductor die and how the conductive bump is formed on the printed circuit board according to the ninth preferred embodiment of the method of this invention.
Figure 43:
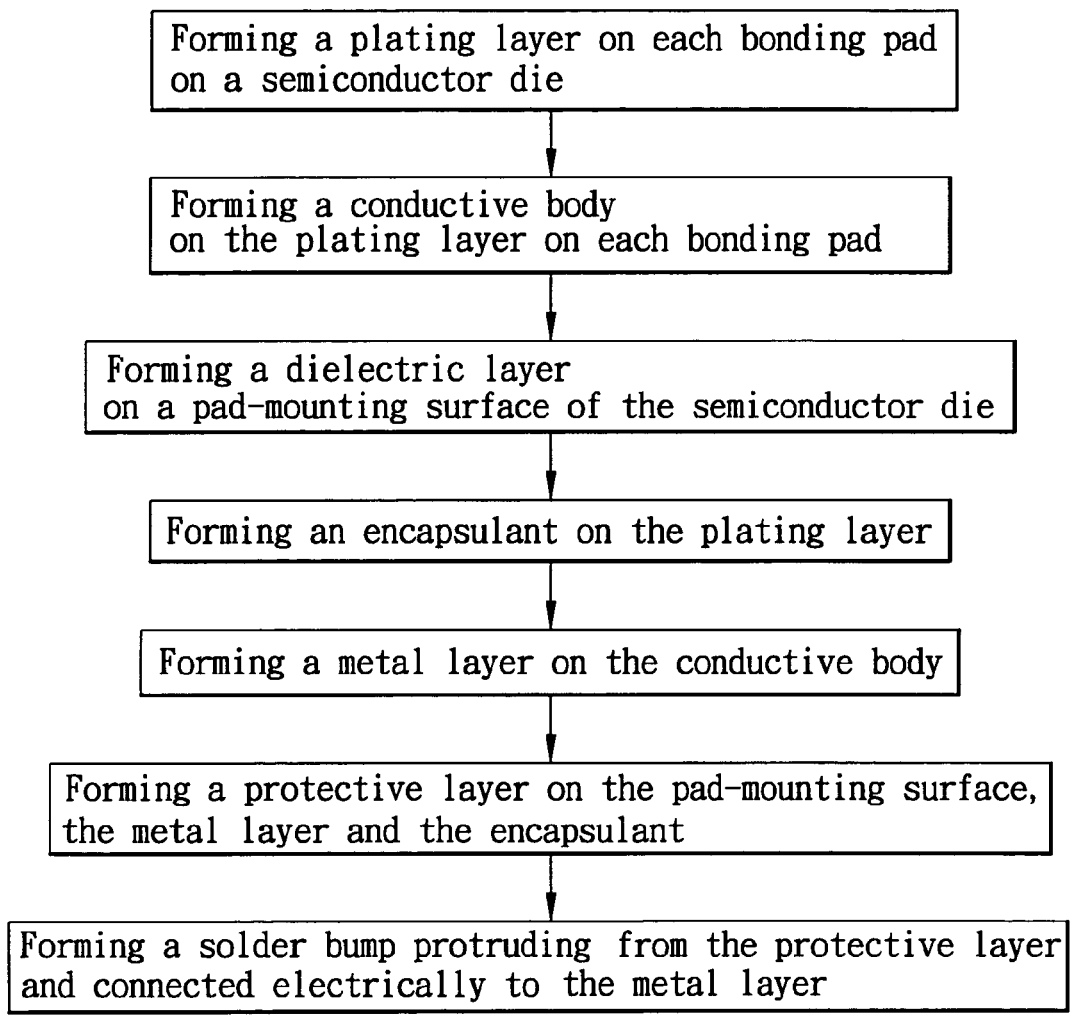
FIG. 43 is a block diagram illustrating the first preferred embodiment of the method for making the semiconductor package according to the present invention.
Figure 44:
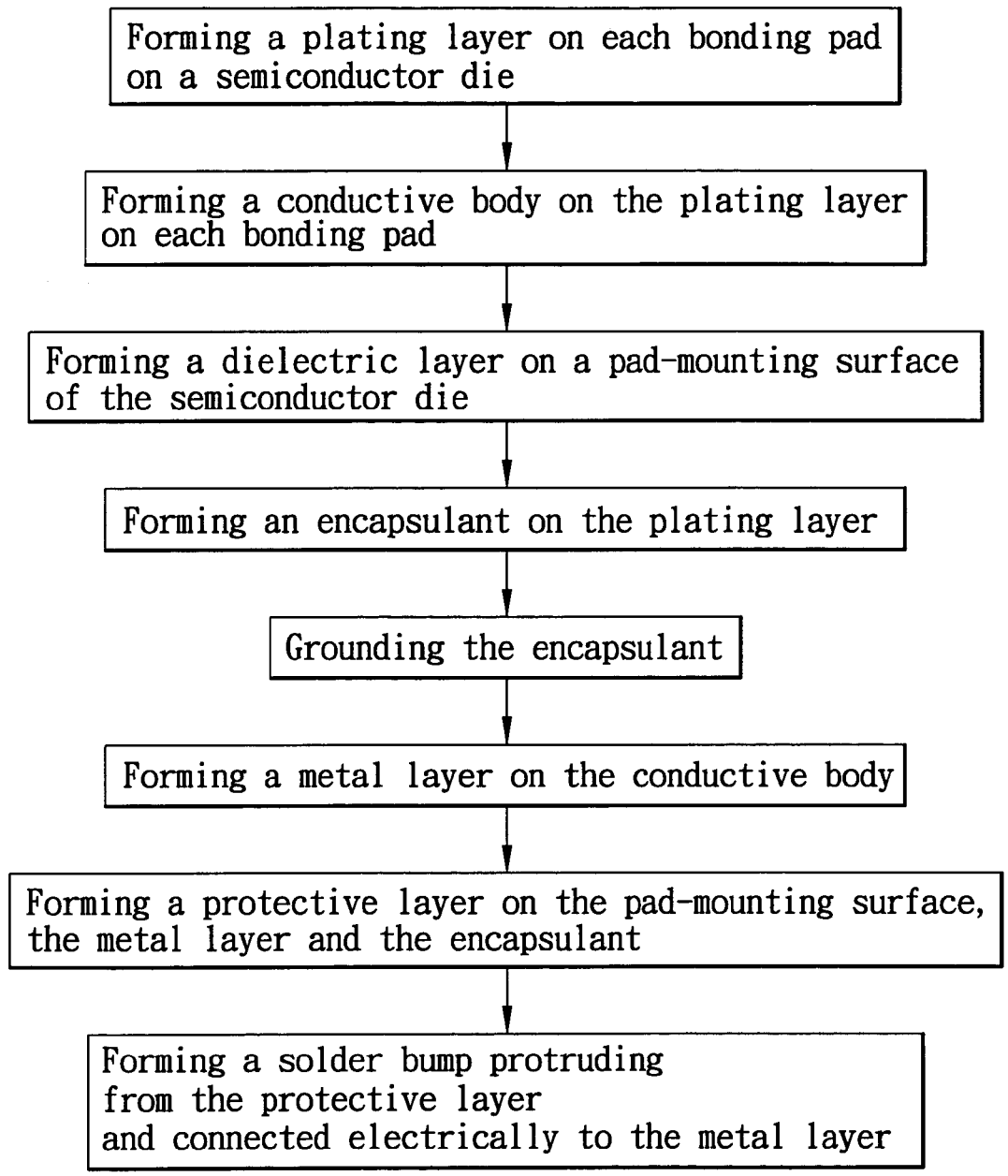
FIG. 44 is a block diagram illustrating the second preferred embodiment of the method for making the semiconductor package according to the present invention.
Figure 45:
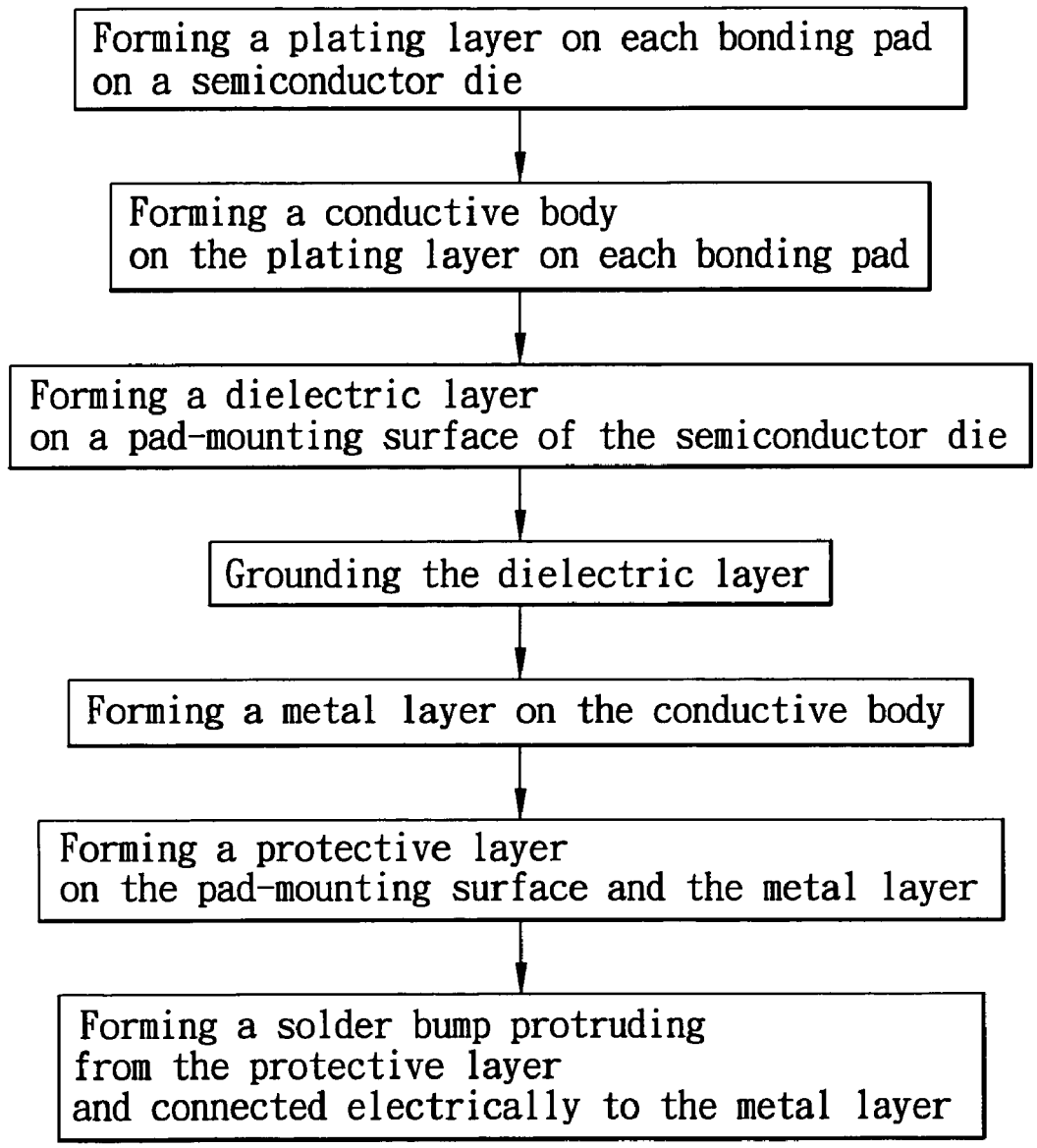
FIG. 45 is a block diagram illustrating the third preferred embodiment of the method for making the semiconductor package according to the present invention.
Figure 46:
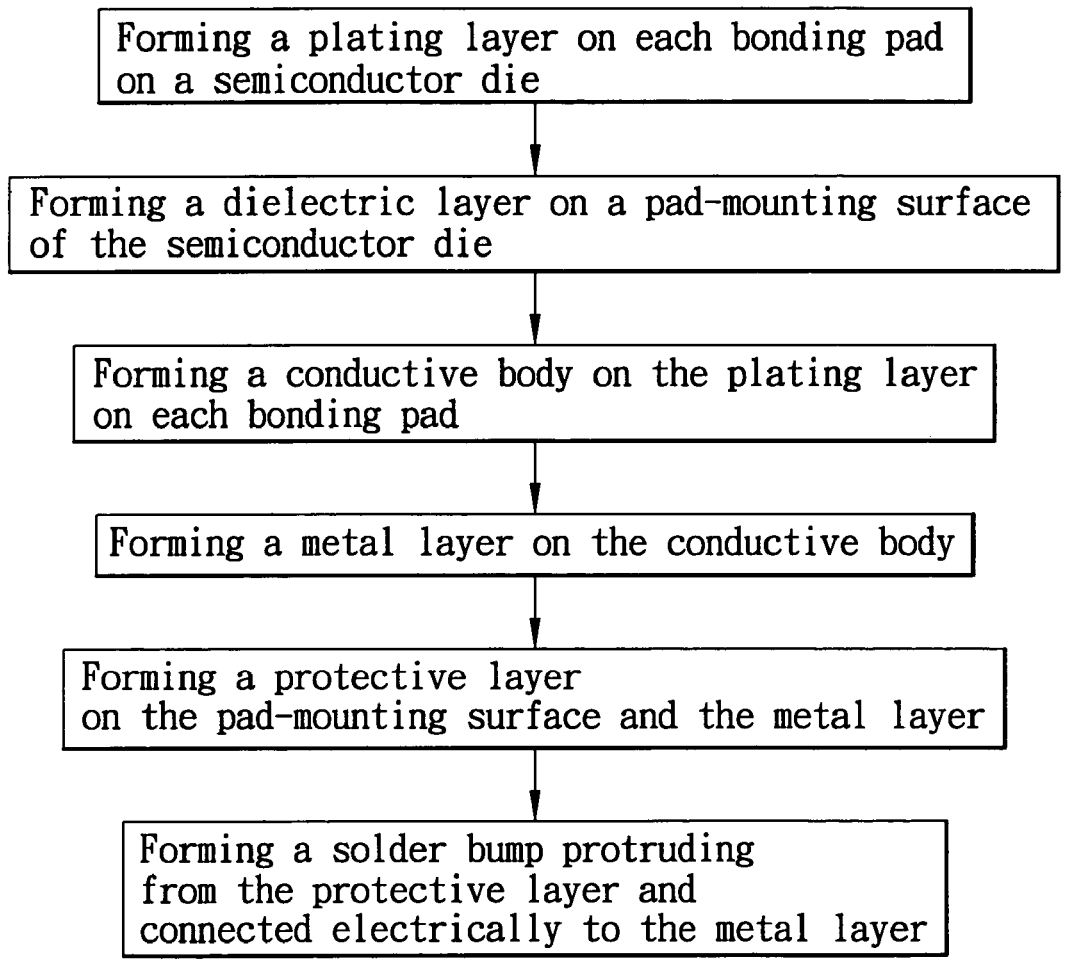
FIG. 46 is a block diagram illustrating the fourth preferred embodiment of the method for making the semiconductor package according to the present invention.
Figure 47:
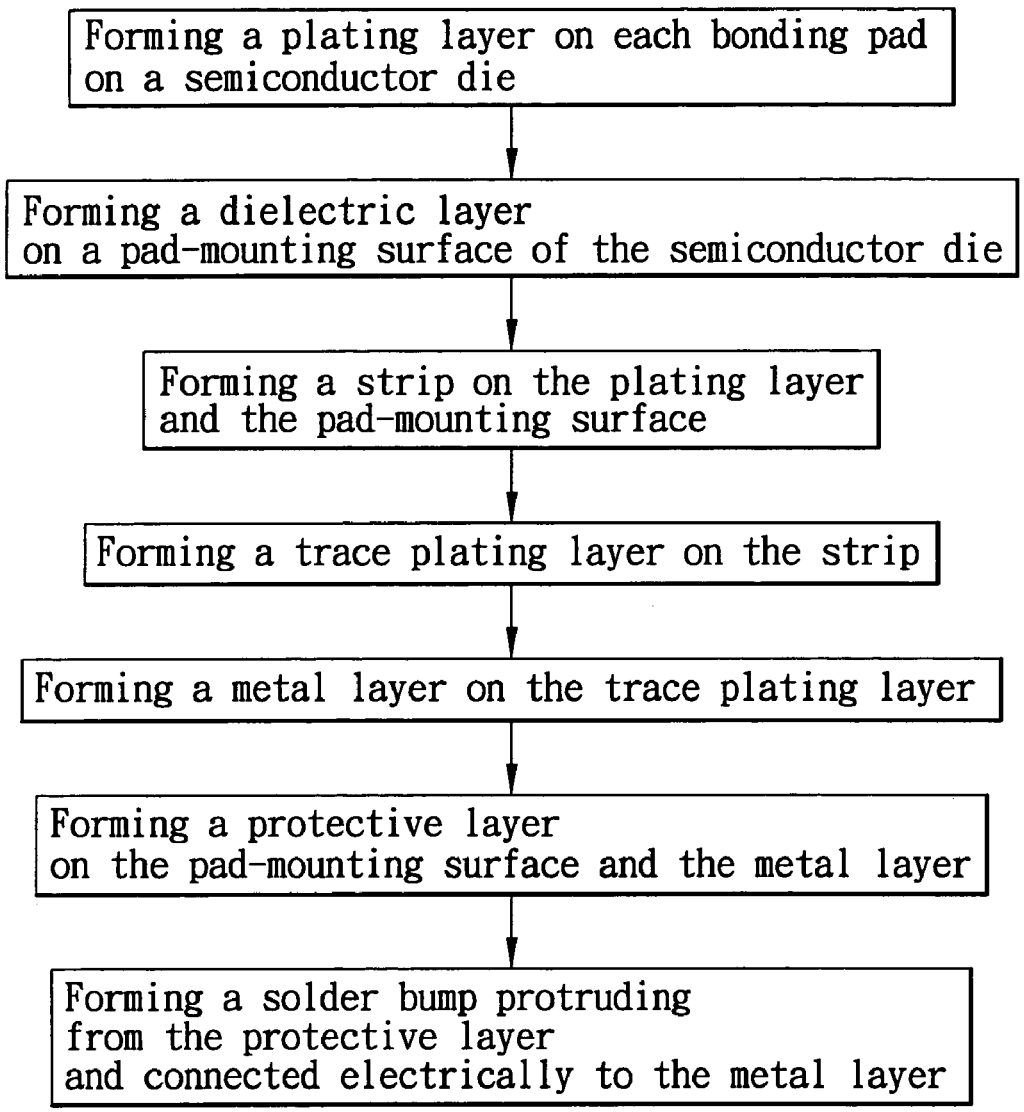
FIG. 47 is a block diagram illustrating the fifth preferred embodiment of the method for making the semiconductor package according to the present invention.
Figure 48:
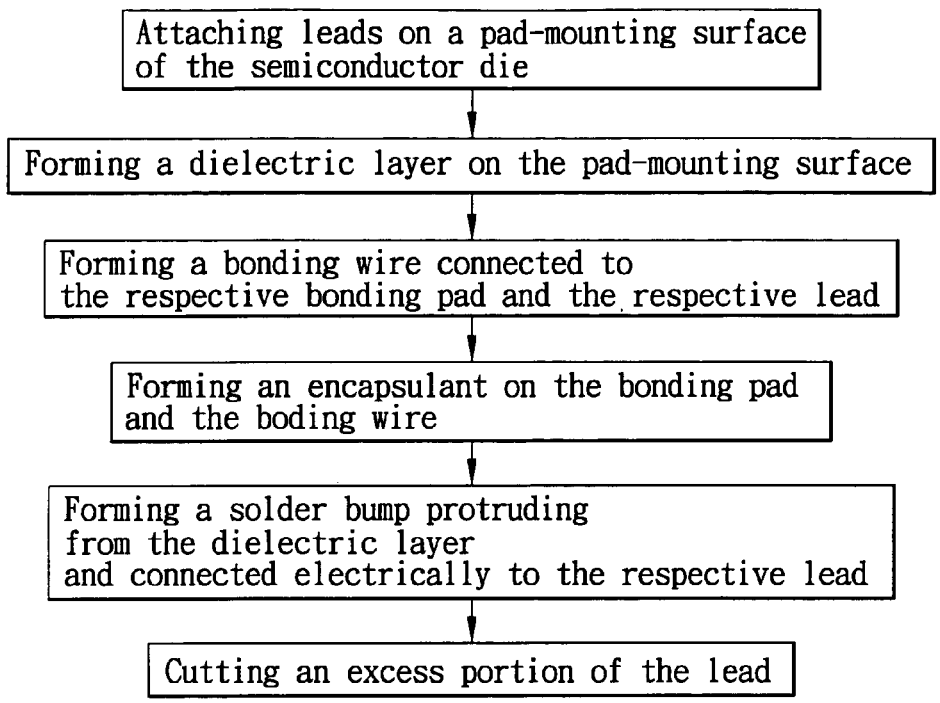
FIG. 48 is a block diagram illustrating the sixth preferred embodiment of the method for making the semiconductor package according to the present invention.

FIG. 42 illustrates the formation of the semiconductor package according to the ninth preferred embodiment of the method of this invention. According to this embodiment, which is modified from the eighth embodiment, the film substrate 43 shown in FIG. 40 is formed with a plurality of pad-through-holes 435, each of which is defined by a hole-defining wall. The back surface 434 of the film substrate 43 is attached to the pad-mounting surface 10 of the semiconductor die 1 in such a manner that each of the pad-through-holes 435 exposes a respective one of the bonding pads 11 therefrom. A conductive layer 433 is formed on the hole-defining wall of each of the pad-through-holes 435, and is electrically connected to the end portion 4311 of a respective one of the conductive traces 431 and a respective one of the bonding pads 11 through the respective metal plating layer 2. A conductive bump 61 is formed on the extension 4312 of each of the traces 431.

With the invention thus explained, it is apparent that various modifications and variations can be made without departing from the spirit of the present invention. It is therefore intended that the invention be limited only as recited in the appended claims.

I claim:

1. A semiconductor package comprising:
a semiconductor die having a pad-mounting surface, and a plurality of spaced apart bonding pads formed on said pad-mounting surface;
a plurality of conductive bodies, each of which has a trace part that is formed on said pad-mounting surface and that is offset from a respective one of said bonding pads in a lateral direction relative to said pad-mounting surface, and a pad-connecting part that extends from said trace part to connect electrically with the respective one of said bonding pads;
a dielectric protective layer formed on said pad-mounting surface and said conductive bodies and formed with a plurality of bump-through-holes, each of which exposes a portion of said trace part of a respective one of said conductive bodies;
a plurality of solder bumps, each of which fills a respective one of said bump-through-holes to connect electrically with said portion of said trace part of a respective one of said conductive bodies and each of which protrudes outwardly from said protective layer; and
a pair of opposite dielectric partition walls that are formed on said pad-mounting surface at two opposite sides of each of said bonding pads, said trace part of each of said conductive bodies extending through a respective one of said partition walls in a transverse direction relative to said partition walls in such a manner that said pad-connecting part of each of said conductive bodies is disposed between said partition walls.

2. The semiconductor package of claim 1, further comprising a plurality of metal plating layers, each of which is formed on a respective one of said bonding pads, said pad-connecting part of each of said conductive bodies being formed on a respective one of said metal plating layers.

3. The semiconductor package of claim 1, wherein each of said conductive bodies is made from conductive paste.

4. The semiconductor package of claim 1, wherein said protective layer is made from epoxy resin.

5. The semiconductor package of claim 1, wherein said trace part of each of said conductive bodies includes a metal layer that is electrically connected to a respective one of said solder bumps.

6. The semiconductor package of claim 5, wherein said metal layer includes a nickel sub-layer and a gold sub-layer.

7. The semiconductor package of claim 1, wherein said partition walls define an inner space therebetween, said semiconductor package further comprising an encapsulant that fills said inner space so as to cover said bonding pads.

8. The semiconductor package of claim 7, wherein said encapsulant is made from epoxy resin.

9. The semiconductor package of claim 7, wherein said encapsulant is made from photo-sensitive ink.

10. The semiconductor package of claim 7, wherein said encapsulant is made from polyimide.

11. The semiconductor package of claim 7, wherein said partition walls have a height, which is measured from said pad-mounting surface, higher than that of said trace parts of said conductive bodies, said pad-connecting parts of said conductive bodies being covered by said encapsulant.

12. The semiconductor package of claim 7, wherein said partition walls have a height, which is measured from said pad-mounting surface, substantially equal to that of said trace parts of said conductive bodies, said pad-connecting parts of said conductive bodies being exposed from said encapsulant.

13. The semiconductor package of claim 1, further comprising a plurality of metal plating layers, each of which is formed on a respective one of said bonding pads, and a plurality of connection-enhancing bosses, each of which is formed on and protrudes from a respective one of said bonding pads, said pad-connecting part of each of said conductive bodies being formed on a respective one of said metal plating layers and enclosing a respective one of said connection-enhancing bosses.

14. The semiconductor package of claim 13, wherein each of said connection-enhancing bosses is made from a photo-resist material.

* * * * *